(12) United States Patent
Traupe et al.

(10) Patent No.: US 8,439,252 B2
(45) Date of Patent: May 14, 2013

(54) METHOD FOR BONDING METAL SURFACES, METHOD FOR PRODUCING AN OBJECT HAVING CAVITIES, OBJECT HAVING CAVITIES, STRUCTURE OF A LIGHT EMITTING DIODE

(75) Inventors: Ulrich Traupe, Wiesbaden (DE); Stefan Weise, Hohenstein (DE); Pellegrino Ballacchino, Wiesbaden (DE); Edgar Spandl, Hunfelden (DE)

(73) Assignee: Excelitas Technologies GmbH & Co KG, Wiesbaden (DE)

( * ) Notice: Subject to any disclaimer, the term of this patent is extended or adjusted under 35 U.S.C. 154(b) by 555 days.

(21) Appl. No.: 12/513,784

(22) PCT Filed: Oct. 31, 2007

(86) PCT No.: PCT/EP2007/009480
§ 371 (c)(1),
(2), (4) Date: Mar. 9, 2010

(87) PCT Pub. No.: WO2008/055616
PCT Pub. Date: May 15, 2008

(65) Prior Publication Data
US 2010/0187560 A1 Jul. 29, 2010

Related U.S. Application Data

(60) Provisional application No. 60/857,140, filed on Nov. 7, 2006.

(51) Int. Cl.
*B23K 1/00* (2006.01)
*B23K 1/19* (2006.01)
*B23K 1/20* (2006.01)

(52) U.S. Cl.
USPC ..... 228/262.1; 228/111; 228/206; 228/262.6; 228/262.61; 228/102

(58) Field of Classification Search ............ 228/111, 228/206, 262.6, 262.61, 102, 262.1
See application file for complete search history.

(56) References Cited

U.S. PATENT DOCUMENTS

| | | | | |
|---|---|---|---|---|
| 3,609,857 A | * | 10/1971 | Kikuchi | 438/121 |
| 4,189,331 A | | 2/1980 | Roy | |
| 4,415,116 A | * | 11/1983 | Norton | 228/180.21 |
| 4,434,347 A | * | 2/1984 | Kurtz et al. | 219/56.22 |
| 4,767,049 A | * | 8/1988 | Butt et al. | 228/111 |
| 4,833,004 A | * | 5/1989 | Senda et al. | 428/210 |
| 7,207,816 B1 | * | 4/2007 | Friske | 439/161 |

FOREIGN PATENT DOCUMENTS

| | | |
|---|---|---|
| DE | 195 06 093 A1 | 8/1996 |
| DE | 10 2004 002841 B3 | 5/2005 |

(Continued)

OTHER PUBLICATIONS

International Search Report and Written Opinion, PCT/EP2007/009480.

*Primary Examiner* — Erin Saad
(74) *Attorney, Agent, or Firm* — Peter A. Nieves; Sheehan Phinney Bass + Green PA (57) ABSTRACT

A method for bonding two partially form-fitting surfaces of two metal bodies which contain the same metal is carried out by generating a first layer on the surface of a first one of the two bodies, the first layer containing a mixture of the metal and the oxide of the metal; generating a second layer on the first layer, the second layer containing the metal but less oxide of the metal than does the first layer; placing the partially form-fitting surfaces of the two metal bodies adjacent to each other; heating the bodies placed adjacent to each other to a temperature which lies in a target range below the melting point of the metal and above the eutectic temperature of the eutectic of the metal and the metal oxide; and holding the temperature within the target range over a predetermined or a controllable duration of time.

24 Claims, 6 Drawing Sheets

FOREIGN PATENT DOCUMENTS

| | | |
|---|---|---|
| DE | 10 2004 012232 A1 | 9/2005 |
| DE | 199 56 565 B4 | 3/2006 |
| FR | 2 411 243 A | 7/1979 |
| GB | 1 117 009 A | 6/1968 |
| JP | 11 061294 A | 3/1999 |

* cited by examiner

METHOD FOR BONDING METAL SURFACES, METHOD FOR PRODUCING AN OBJECT HAVING CAVITIES, OBJECT HAVING CAVITIES, STRUCTURE OF A LIGHT EMITTING DIODE

CROSS-REFERENCE TO RELATED APPLICATIONS

This application is the National Stage of International Application No. PCT/EP2007/009480 International Filing Date, 31 Oct. 2007, which designated the United States of America, and which International Application was published under PCT Article 21 (2) as WO Publication No. 2008/055616 and which claims priority from U.S. Provisional Application No. 60/857,140, filed on 7 Nov. 2006, the disclosures of which are incorporated herein by reference in their entireties.

BACKGROUND

1. Field

The disclosed embodiments relate to a method for bonding two metal surfaces, a method for producing an object preferably having cavities therein, an object having cavities, and a structure of a light emitting diode.

2. Brief Description of Related Developments

A typical field of use of the aspects of the disclosed embodiments is the production of small, flat, but complex-shaped cooling elements having a supply opening and a drain opening for a cooling fluid and having fluid channels formed in the cooling element. Such cooling elements can, e.g., be used for small semiconductors, such as semiconductor laser diodes.

The basic method serves for bonding two partially form-fitting surfaces of two metal bodies which comprise the same material or consist of the same material/metal. The bodies can be flat bodies, such as thin sheet metal or foils. They can be structured, then superposed on each other and, subsequently, bonded to each other, so that in the interior the desired structures are formed according to the structuring of the individual bodies/sheets/foils.

Figure 6:
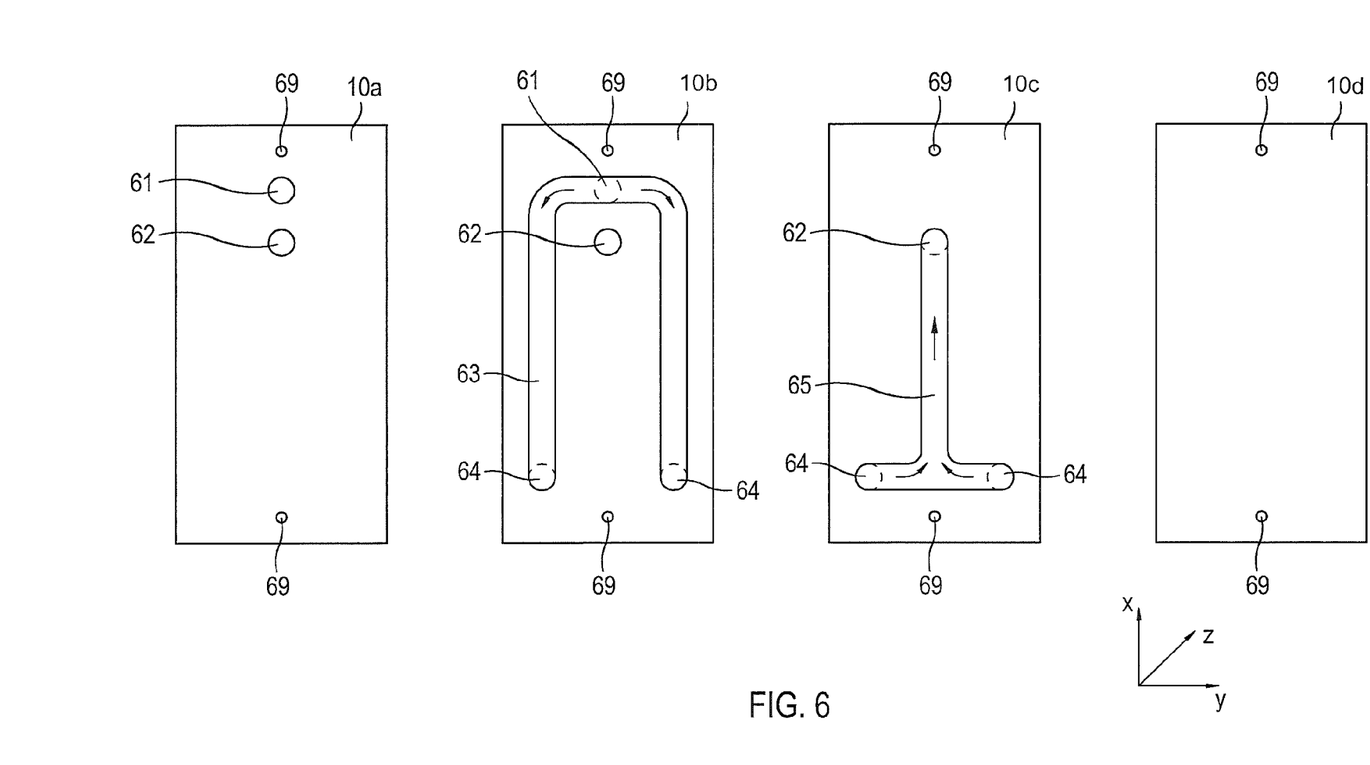
FIG. 6 shows an application of the aspects of the disclosed embodiments.

FIG. 6 exemplarily shows the underlying technology. There are provided several bodies 10a, 10b, 10c and 10d which can be structured individually. Reference numerals 61, 62, 63, 64, 65 and 69 denote cut-outs of the otherwise provided plain of the body. The bodies 10 are metal sheets or foils, e.g. sheet copper, of a thickness (in FIG. 6 in z-direction, perpendicularly to the plane of projection) of preferably below 2 mm, further preferably below 1 mm, further preferably below 0.5 mm. After their making, e.g. in the shapes as shown in FIG. 6, the metal sheets are superposed on each other in a way still to be described and are bonded to each other in a fluid-tight manner, so that within the object cavities corresponding to the recesses in the individual bodies are formed.

In the shown example, 10a designates the uppermost body of the stack to be formed. The holes 69 do not have any relation to the cavities to be formed in the object. They are rather alignment structures which facilitate the precise superposition of the individual bodies 10. 61 and 62 are openings, wherein, e.g., 61 may be a supply for a fluid and 62 a drain for the fluid. 10b is the second body lying beneath the first body. It shows a horseshoe-shaped channel 63 which is positioned and designed in such a way that its above horizontally located leg is in fluid communication with the schematically shown supply opening 61 of the body 10a. According to the directions of the arrows the fluid can flow downwards in the drawing plane to the areas 64 which are in fluid communication with the areas 64 in the third body 10c lying farther below. The body 10b also shows an opening 62 which is in fluid communication with the opening 62 in the body 10a and through-connects the same "downwards". The body 10c shows a recess 65 according to an upside-down T. From the areas 64 the fluid can flow upwards in the drawing plane up to the area 62 which, in its spatial position, corresponds to the areas 62 in the bodies 10b and 10a, so that the fluid can flow off again via this connection. The body 10d finally is a lid which seals off the cooling element against beneath.

In the z-direction the overall structure can have a thickness of few millimeters. The structure can be more complex than that in the example of FIG. 6. If the thickness of a body 10a in z-direction is, e.g., 0.3 mm and 8 layers are superimposed to each other, an overall structure having a thickness of about 2.4 mm is formed.

When bonding the individual bodies 10 this must be effected in such a way that the bond is fluid-tight all around and unsusceptible towards temperature variations and influences of the flowing fluid.

The bodies 10 can comprise copper or can consist thereof to a large proportion.

For bonding the bodies a method being termed "direct copper bonding" has been known. In this method the surfaces of the copper plates to be bonded to each other are coated with a eutectic mixture of copper and copper oxide ($Cu_2O$ and $CuO$) of a specific thickness. Then, the surfaces coated in such a way are placed adjacent to each other and heated to a temperature between the melting point of pure copper (about 1083° C.) and the melting point of the above-mentioned eutectic (about 1063° C.), e.g. to about 1070° C. Caused by the heating the eutectic melts and the subsequent solidification leads to a connection of the surfaces.

The disadvantage of this known method is that $Cu_2O$ as well as $CuO$ are thermally instable and, therefore, tend to decompose during the heating process up to the above-mentioned temperature, so that, when the target temperature has been reached, the conditions regarding the eutectic are no longer as they were desired, so that the bonding process would be unsatisfactory without further stabilizing measures. In order to obtain satisfying results, during the heating process a suitable partial pressure of oxygen must be set, and/or additional oxidizing agents must be used, e.g. manganese dioxide. The control of the partial pressure of oxygen is, however, complex, and the use of manganese dioxide leads to further undesired decomposition products and to instabilities of the produced object.

Further known techniques in the relevant field can be inferred from DE 3930859 C2, DE 102004012232 A1, DE 19956565 B4 and from DE 102004002841 B3.

SUMMARY

The aspects of the disclosed embodiments are directed to a method for bonding two partially form-fitting surfaces of two metal bodies of the same metal, which method is easy to perform and leads to a reliable connection of the bodies. Accordingly, they are also directed to a method for producing an object having cavities therein is indicated and an accordingly produced object.

The problem underlying the disclosed embodiments is solved by the features of the independent claims. Dependent claims are directed on preferred aspects of the disclosed embodiments.

In a method according to the aspects of the disclosed embodiments for bonding two partially form-fitting surfaces of two metal bodies which comprise the same metal the following steps are performed:

First of all, on at least one of the form-fitting surfaces of the two bodies a first layer is generated which comprises the metal and an oxide of the metal. Then, above the first layer a second layer is formed which comprises the metal and less oxide, preferably no oxide of the metal. Subsequently, the partially form-fitting surfaces of the two bodies are placed adjacent to each other and are, in this state, heated to a temperature between the melting point of the metal and the melting point of the eutectic of metal and metal oxide. The temperature is held in this range over a predetermined or controllable period of time.

Differently from the known method, the surface is not only coated with a layer of a mixture of metal and metal oxide, but thereabove with a layer again comprising the metal which already lies below the layer of the mixture. Only then the bodies prepared in this way are placed adjacent to each other and heated to the desired temperature.

Surprisingly it showed that by way of this procedure a more reliable connection of the metal surfaces can be obtained without additional supporting measures, such as the control of a partial pressure of oxygen or the addition of an oxidizing agent, being necessary.

In the case of a method for producing an object having cavities therein the object is composed layer by layer, the layers being formed by bodies as defined above. These bodies are designed in accordance with the desired cavities and bonded to each other according to the above-described method. Such an object can comprise a plurality of layers and, accordingly, a plurality of bodies bonded to each other, e.g., 5 to 10 layers which are formed by, accordingly, five to ten laminar bodies.

"Form fitting surface" in the sense of this specification may mean a form fit over a smaller or larger range in each of the two dimensions of the plane of the surface of one body with an adjoining surface of another body. It may mean also a comparatively small surface area and thus also more or less punctual touching surfaces. Two bodies may touch each other in a plurality of not-connected regions, each region for it alone showing a form fit as defined above. The form fit may be given by the rigid shape of the individual bodies or through pressing the bodies on each other during heating.

One or more of the bodies may comprise a special copper alloy. The alloy may comprise another metal, in particular aluminum, in a proportion of 0.05% by weight to 0.5% by weight, preferably, 0.1-0.2% by weight. The aluminum may be dispersed in the shape of smallest particles of aluminum oxide ($Al_2O_3$) in the remaining copper. Such alloy is clearly harder than Cu alone. Therein, life-shortening flushouts of the material of the object by the fluid passing through are considerably reduced so that lifetime is noticeably increased. In order to guarantee the bonding of the individual bodies also with this alloy a certain pressure or march of pressure may be exercised on the bodies superimposed on each other during the influence of heat. In order to improve the solderability of the surface of the developing body the outermost surface thereof may be provided without the aluminum alloyed thereinto.

The fluid may comprise water or an oil or a gas. The pressure difference between the supply opening and the drain opening may be above 0.1 MPa or even above 0.3 MPa.

BRIEF DESCRIPTION OF THE DRAWINGS

In the following individual exemplary aspects of the disclosed embodiments are described with reference to the drawings, in which.

DETAILED DESCRIPTION OF THE DISCLOSED EMBODIMENTS

Figure 1:
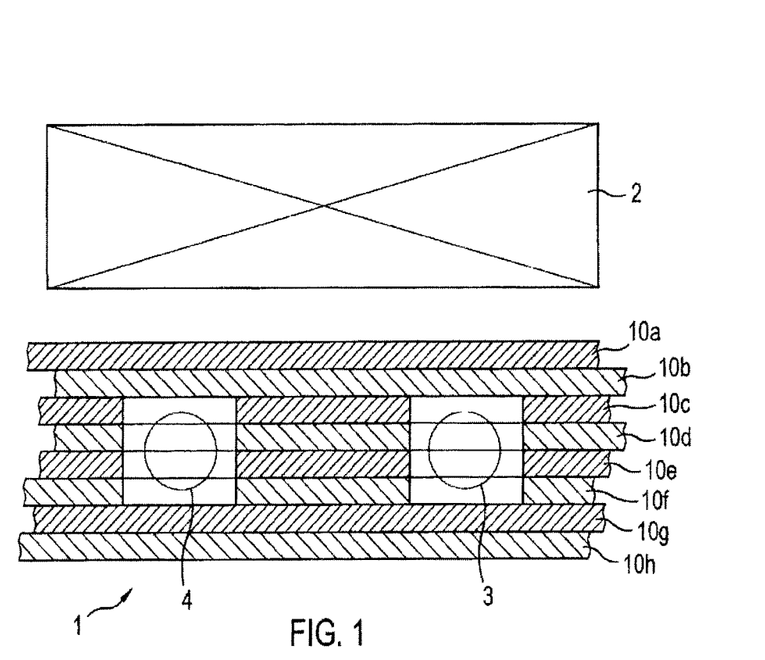
FIG. 1 is a sectional view of an object structured according to the disclosed embodiments.

FIG. 1 shows an object 1 which can, e.g., be a cooling element for a semiconductor component 2. In the interior of the object 1 cavities 3, 4 can be formed which can, e.g., be fluid channels for a cooling fluid.

The object 1 is formed by layers. In the shown example the layers are formed by plates which form bodies 10a to 10h to be bonded to each other according to the aspects of the disclosed embodiments. The plates have at least partially form-fitting surfaces which are bonded to each other. Often, the surfaces will be planar or flat. However, in general, the aspects of the disclosed embodiments can be applied to partially form-fitting surfaces, even if the same are not planar.

Figure 2:
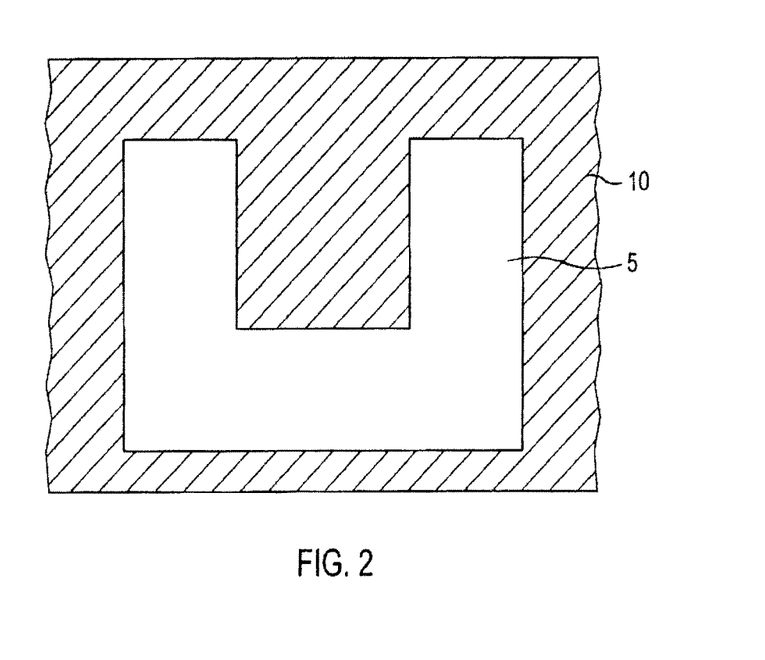
FIG. 2 is a top view on a body used according to the disclosed embodiments.

Each individual plate or each body 10 can be designed individually. FIG. 2 shows an example for this. It is the top view on a body 10. Reference numeral 5 designates a recess in the otherwise planar or plate-like body 10. In the assembled state of the individual bodies the recess contributes to a cavity in the interior of the object 1. The bonding of the bodies/plates 10 with each other is effected in the not recessed areas, i.e. at the surfaces of the hatched areas of the bodies 10 of FIG. 2, as far as the same are covered by corresponding surfaces of the body lying thereabove or therebelow.

Figure 3:
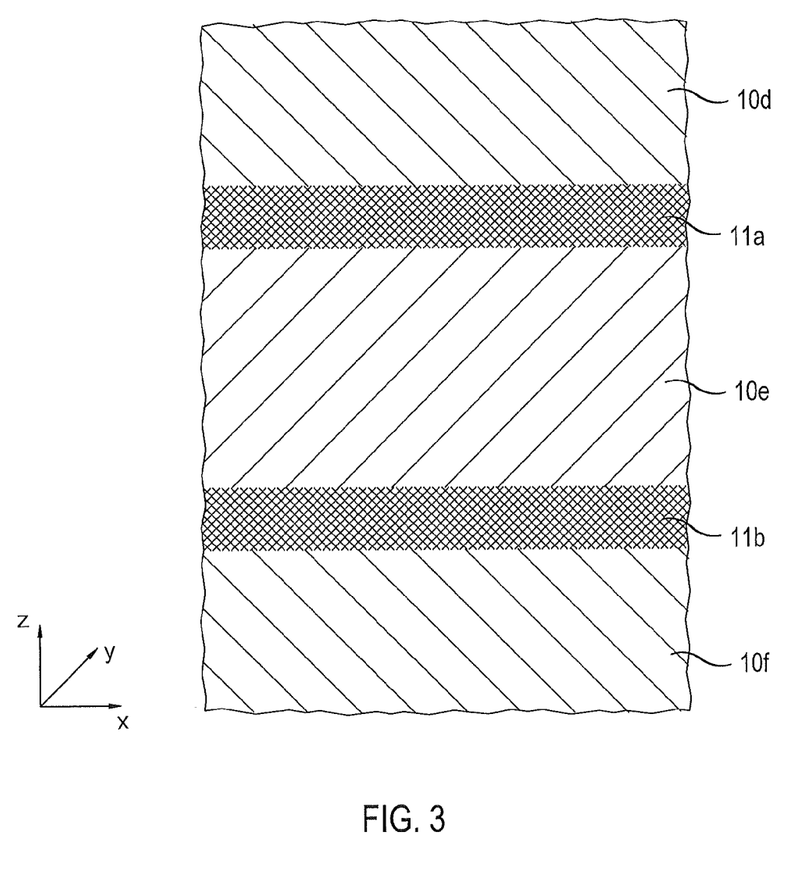
FIG. 3 is an enlarged schematic sectional view of an area of the formed object.

FIG. 3 schematically shows the state of the generated object after the method according to the aspects of the disclosed embodiments has been terminated. In FIG. 3 reference numerals 10d, 10e and 10f designate areas which correspond to the originally insofar separately present bodies 10d, 10e and 10f. Reference numerals 11a and 11b designate transition areas which have come into existence by the method according to the disclosed embodiments. They are areas of a molten and then solidified mixture of the metal and the metal oxide.

The mixture ratio will be close to, and partially exactly, the eutectic ratio of the components metal and metal oxide. Because of the thermal instability of the metal oxide the latter has partially decomposed during the heating process. The oxygen set free in this connection also led to the second layer above the first layer, i.e. the metal layer, being oxidized. Insofar, also this layer merged into a mixture of metal and metal oxide which, after the termination of this process, is no longer clearly distinguishable from the first layer lying therebelow. Furthermore, in the case of a suitable selection of the layer thickness, the oxygen set free during the decomposition also oxidizes the copper surfaces of the body lying opposite thereto, so that also in this respect a mixture of metal and metal oxide is generated which has a melting point below that of the pure metal. Since, insofar, also the opposite surface starts to melt and then solidifies, the connection resulting after cooling is a particularly intimate and enduring one.

Surprisingly, it showed that the coating of the first layer (layer of a mixture of metal and metal oxide) by a second layer which comprises less to preferably no oxide, but only the metal, acts in a stabilizing way on the process in that, despite the instability of the metal oxide, the melting together of the bodies at the interfaces thereof (transition from one body to the other body at their adjoining, form-fitting surfaces) takes place in an undisturbed, reliable, homogeneous and helium-tight way. Theoretically, it is not completely explicable by which mechanism the second layer contributes to the stabilization of the conditions. A relevant effect in this connection might, however, be at least the oxidation of the second layer by oxygen set free from the first layer.

FIG. 4 shows the various states in the method according to the aspects of the disclosed embodiments. FIG. 4a is a lateral view of a body according to the disclosed embodiments, which is shown with cut left and right sides, respectively. First a first layer 12 is applied onto the surface of the body 10e, as is shown in FIG. 2b, which layer is a mixture of the metal of the body 10e and the oxide of this metal. Preferably this layer contains more oxygen (bound in the oxide) than it would be the case in a purely eutectic mixture of metal and metal oxide. The eutectic mixture ratio lies at 1.6% by atom of oxygen. At this stage of the procedure the proportion of oxygen can lie at least 10% above the eutectic proportion. It can lie at most 150% above the eutectic proportion.

Figure 4A:
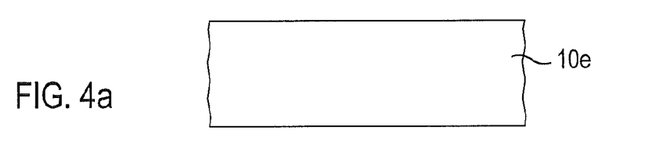
FIG. 4 shows the individual steps of the method according to the disclosed embodiments.
Figure 4B:
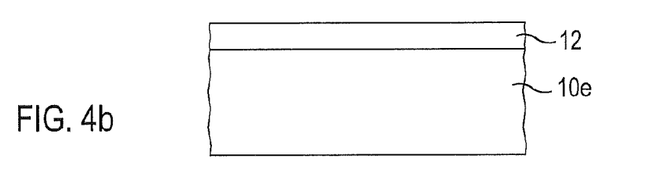
Figure 4C:
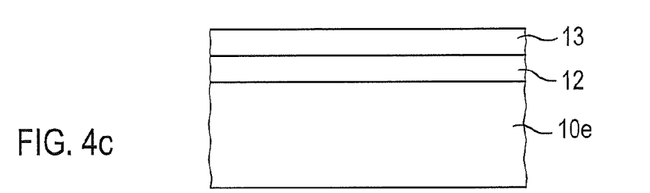

According to FIG. 4c a second layer 13 is applied onto the first layer 12. This second layer 13 comprises the metal and less metal oxide than does the first layer, preferably at most 20, further preferably at most 10, still further preferably at most 5% of the amount of oxide of the first layer. In a preferred embodiment, the second layer 13 comprises practically no oxide and, thus, is a metal layer, the material of which is substantially equal to that of the body 10e.

Figure 4D:
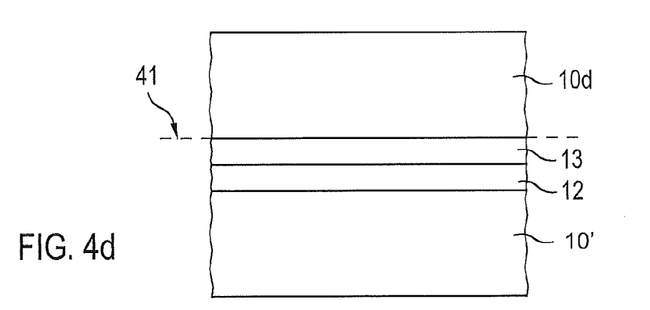
Figure 4E:
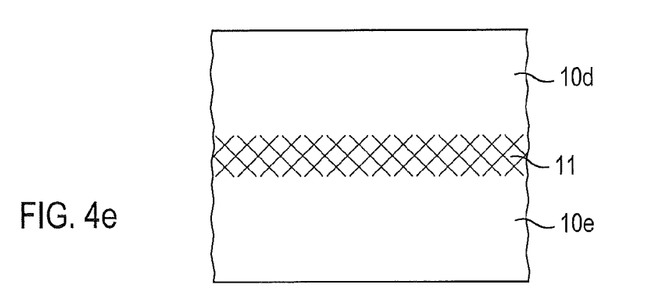

FIG. 4d shows that, from above, a second body 10d is placed on the first body 10e prepared in the described way. The dashed line 41 marks the interface between the initially separate bodies 10e and 10d. The bodies are then held together in the desired position and heated to a temperature in a target temperature range, the lower limit thereof being the melting point of the eutectic of metal and metal oxide and the upper limit thereof being the melting point of the pure metal. In this temperature range the temperature is held for a certain period of time, so that the mixture of metal and metal oxide starts to melt and the reaction of the oxygen set free from the decomposing metal oxide with the surrounding metal can take place.

At last, the cooling of the bond, e.g. down to room temperature, takes place, and a result according to FIG. 4a ensues, as it was already shown in larger representation in FIG. 3 and described with reference thereto.

In the transition area 11 formed in this way, a mixture ratio near to the eutectic ratio will be present. The eutectic mixture ratio will be present at least partially (in z-direction). Insofar, a self-regulating mechanism is given: Because of the instability of the metal oxide, in particular in the case of copper, the oxide decomposes so that oxygen is set free and can react with the non-oxidized metal in the body 10 itself, on the one hand, and in the second layer 13, on the other hand. In the case of an initially hypereutectic oxygen content this leads to oxygen being available for extending the mixture of metal and metal oxide into the direction of the body 10, on the one hand, and of the second layer 13, on the other hand, with the possibility of generating eutectic mixture regions. If, then, the concentration of oxygen decreases into the hypoeutectic range the phasewise solidification sets in, so that the extension of the mixture layer in z-direction is retarded and finds its natural end.

The overall dimensions of the generated object in x- and in y-direction (plane of projection of FIG. 6) can—in one or both dimensions—be smaller than 40 mm, preferably also smaller than 20 mm, respectively.

The metal used can be copper or comprise copper. It can be a copper alloy. In particular, the bodies can comprise more than 90%, preferably more than 98% (% by weight or volume) of copper. Accordingly, the first layer is a mixture of mainly copper and copper oxide, and the second layer mainly comprises copper. Preferably, the oxide is mainly $Cu_2O$. CuO is preferably present to an amount of less than 10% by weight, further preferably to less than 1% by weight.

The first and/or the second layer can generally be produced by applying the metal of the metal body in the form of fine particles on the surface thereof in a controlled atmosphere. If the first layer 12 is to be produced, the atmosphere can be oxygen or comprise oxygen. If the second layer 13 is to be produced, the atmosphere can be or comprise an inert gas, preferably a noble gas, preferably argon. It is, e.g, possible to produce the first layer by sputtering copper thereon in an oxygen atmosphere until the desired layer thickness has been reached.

Applying the first layer can also be performed by oxidizing the surface of the body preferably in an atmosphere being controlled with regard to temperature and/or gas content. The first layer can have a layer thickness of below 10 μm, preferably below 5 μm, further preferably below 2 μm. Its thickness can be larger than 0.1 μm, preferably larger than 0.2 μm.

The second layer can be produced by electroplating or by sputtering on the first layer in an inert atmosphere, preferably a noble gas atmosphere, e.g. an argon atmosphere. The generation of the first and/or the second layer by sputtering can be performed at room temperature. The second layer can have a layer thickness of below 10 μm, preferably below 5 μm, further preferably below 2 μm. Its thickness can be larger than 0.1 μm, preferably larger than 0.2 μm.

Before the step of applying the first layer onto the surface of the body a step of cleaning the surface and/or a step of mechanically processing the surface can be performed. The cleaning can be a mechanical and/or a chemical cleaning.

Figure 5A:
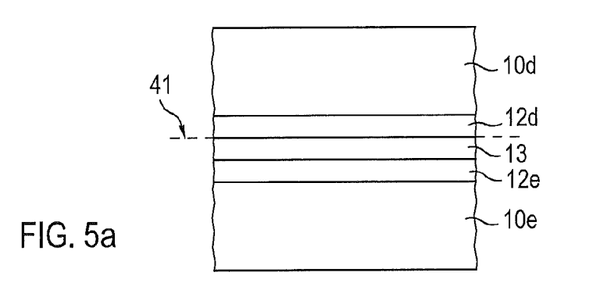
FIG. 5 shows the variants as to the method of FIG. 4.
Figure 5B:
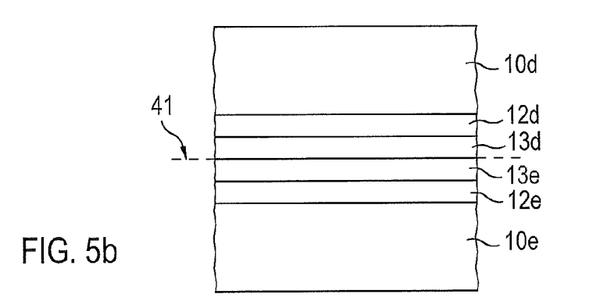

FIG. 5 shows variants of the method according to FIG. 4. FIG. 5a as well as FIG. 5b are alternatives to the structure of FIG. 4d. As regards FIGS. 5a and 5b each shows the state after the preparation of the surfaces and the placing of the two form-fitting surface areas of the concerned bodies adjacent to each other before the heating process. Reference numeral 41 again designates the interface between the two initially loose bodies.

According to FIG. 5a not only the lower body 10e (or generally the surface of the one body) is coated with a first and a second layer, rather also the lower surface of the upper body 10d can be coated with a first layer 12d which is, therefore, a mixture of metal and metal oxide and which can have the same properties as has the corresponding first layer of the body 10e lying below in FIG. 5a. In this state the two bodies 10e and 10d are placed adjacent to each other and then, as described above, are heated, held at the high temperature, and then again cooled down.

In the variant of FIG. 5b also the second body 10d is coated with a first layer 12d as well as with a second layer 13d on the first layer 12d. The second layer 13d is again a metal layer which can have the same properties as has the layer 13 of FIG. 4c. In this state, the two bodies are placed adjacent to each other and further processed as described.

Figure 5C:
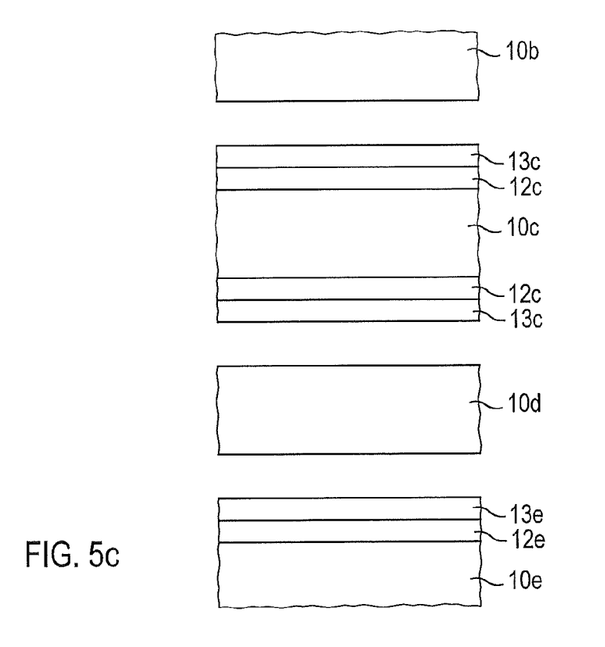

FIG. 5c shows an embodiment in which more than two bodies are bonded to each other. Schematically shown is the state shortly before the bodies 10b, 10c, 10d and 10e with possibly present layers thereon are placed adjacent to each other. The procedure can be such that each second body (10c and 10e in the Figure) is coated on both sides with a first layer 12 and a second layer 13 (12c, 13c, 12e, 13e), whereas the body 10b and 10d lying therebetween, respectively, was not further prepared apart from a possibly effected mechanical and/or chemical cleaning and a mechanical processing of its surface. In this state, the bodies can be placed adjacent to each other, pressed together, and then heated as described, held in the heated state, and then cooled down again.

If three or more bodies are bonded to each other at the same time, the step of heating is generally performed commonly for all these bodies in one single stack. The preceding steps of cleaning and of forming the structure of layers can, however, be performed separately.

Not shown variants of the embodiment of FIG. 5c are:

Each body is coated at both sides with a first layer 12 and a second layer 13. In this embodiment the bodies are placed adjacent to each other and further processed.

Each body is coated with a first layer 12 and a second layer 13 on one of its surfaces and is placed in this manner adjacent to the surface of the adjoining body not coated in this way, particularly not coated at all.

Hybrids of the above variants are possible as well.

Generally, at each interface (transition from one body to the other body, according to the dashed line 41 in FIGS. 4d, 5a, 5d) at least one surface of one of the participating bodies is to be coated with a first and a second layer. The surface of the other body can comprise a first layer and, possibly, also a second layer.

The heating of the bodies placed adjacent to each other can be effected in such a way that a predetermined temperature profile over the time is reached. If necessary, the same can be subjected to a open-loop or closed-loop control.

The object produced by the described method can be a cooling element through which cooling fluid passes. Its maximum overall dimension in the direction of the stack (thickness direction of the bodies) can be below 10 mm, preferably below 5 mm.

The adjoining bodies including first and second layer can be heated to a target temperature Tz of 1071° C.±6° C., preferably ±2° C. The stacks superposed to each other can be held in the above-mentioned temperature range for a period of 10 to 30 minutes.

A copper alloy may be used as a material for one or more or all bodies used for producing the object. The alloy may comprise another metal, particularly aluminum, in a proportion of 0.02% by weight to 1% by weight, preferably 0.1-0.2° A) by weight. The aluminum may be dispersed in the shape of particles of aluminum oxide ($Al_2O_3$) in the remaining copper. The average grain size may be <100 or <10 μm or may be <1 μm. Such alloy is clearly harder than Cu alone. Therein, life-shortening flushouts of the material of the object by the fluid passing through are reduced so that lifetime is increased.

In order to guarantee the bonding of the individual bodies with this alloy as well, it is possible to exert a certain pressure or march of pressure on the bodies superimposed on each other during the influence of heat. The target temperature Tz during the exertion of pressure may be below the melting point of the eutectic made of copper and copper oxide without pressure load, in particular more than 50° C. or more than 100° C. below it. The stacks superimposed on each other may be kept for a period of 5 to 50 minutes, preferably 10 to 30 minutes and more preferably 15 to 25 minutes.

The pressure exerted on the bodies superimposed on each other may be above 0.3 or above 0.5 MPa. It may be below 5 or below 2 MPa. The period of the pressure exertion may be over 5 or over 10 minutes. It may be below 100 or below 60 minutes.

Figure 7:
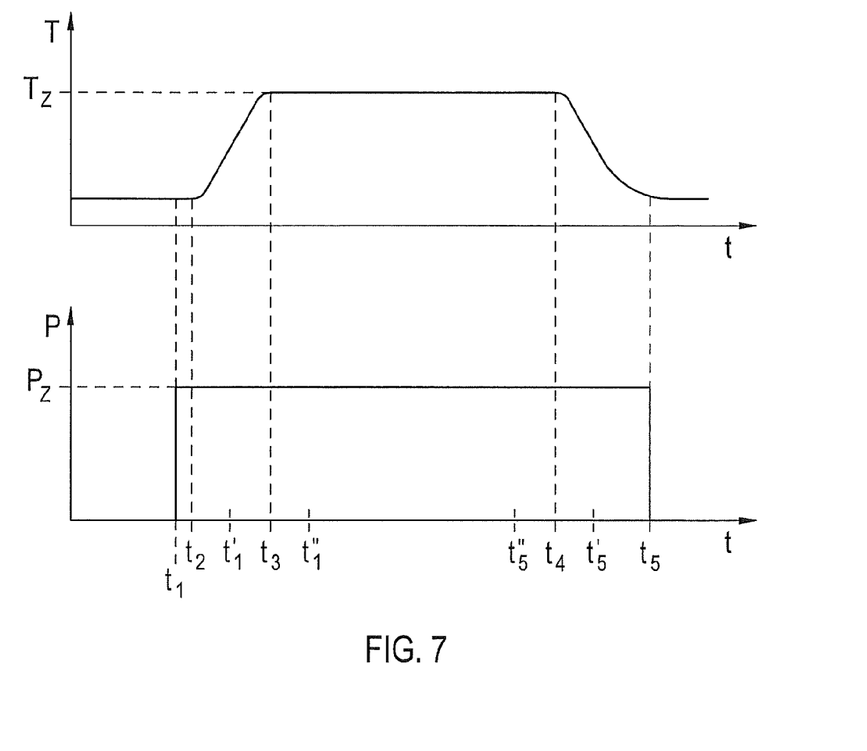
FIG. 7 shows marches of temperature and pressure during the bonding of the bodies.

FIGS. 7a and 7b each show a march of temperature and a march of pressure over the time. As shown, at the time t1 the target pressure pz may be generated before heating is started at the time t2. A stack of bodies to be bonded may be clamped, for example, between two clamping jaws. The clamping force may be adjustable, measurable and controllable.

Then heating is performed at the time t2. The clamping jaws may be heatable, for example, or the overall structure of clamping and bodies will be heated. The temperature and/or its gradient may be measurable, detectable and controllable; a temperature sensor may be provided. Within a certain period the target temperature Tz is reached at the time t3 and is kept thereafter for a certain period until the time t4. The target temperature may also be a temperature range within which variations are permissible or may also be generated.

Subsequently, the heating is turned off at the time t4 so that the overall structure starts to cool down. Cooling may take place passively by observant temperature compensation. It may also show active cooling, for example a fluid cooling in the clamping jaws. After a certain temperature Tb has been undercut at the time t5, the force relief may take place.

Differently to what is shown the pressurization may be begun after heating has started, before or even after reaching the target temperature (times t1' and t1", respectively). The pressure relief may also be performed before the determined temperature Tb has been reached, before or after the target temperature is undercut (times t5' and t5", respectively). FIG. 7b shows a sudden pressurization and pressure relief. However, it is also possible to instead build up and/or discharge the pressure continuously over a certain period or via several steps.

Heating may take place in a conveyor furnace into which particularly a stack of bodies already clamped and thus pressurized is moved. There it remains for the desired period of time so that the target temperature is reached and then kept for the desired period. Then, the structure is removed out of the furnace and cools down.

Three or more bodies may be pressurized simultaneously as a stack. As the force exerted between two respective adjacent bodies will then always be the same but the lay-on surfaces according to the channel geometry may be different, which would also lead to different pressures during the bonding process in various boundary surfaces one or more compensation openings may be provided in one or a plurality of the bodies, particularly in interior bodies (10b-10g in FIG. 1, but then not for 10a, 10h), which make the lay-on surfaces between two respective bodies less unequal—and equal at best—and thus lead to less uneven pressure ratios during the pressurization when the bodies are bonded. The compensation openings may be provided separately of the otherwise provided openings or may be extensions of the same.

Considering the several lay-on surfaces between several pairings of respective two adjacent bodies, these lay-on surfaces may be dimensioned such that the surface of the largest of them is less than 50%, preferably less than 30%, over that of the smallest. Thus, for example, in body 10b of FIG. 6 the opening 62 may be enlarged following the branch 65 lying below it in order to reduce the lay-on surface between the bodies 10a and 10b and to approximate it to that between the bodies 10b and 10c.

The fluid may comprise water or an oil or a gas. The pressure difference between the supply and the drain may be above 0.1 MPa or also above 0.3 MPa. The first layer 12 and/or the second layer 13 may also be made of the alloy mentioned or made starting from the alloy mentioned. The proportions stated insofar may then be related to the proportion of copper alone or to the alloy in total.

One or more outer surfaces of the object (also the upper surface of the body 10a and/or the lower surface of the body 10h in FIG. 1) may comprise another alloy or non-alloyed copper instead of the mentioned alloy to enhance the solderability of the surface of the developing body. The exterior bodies (10a, 10h) may in total consist of this differently alloyed material.

Thus, an object, in particular a cooling body which is structured in layers from several metal bodies bonded with each other is an aspect of the disclosed embodiments, the metal being an alloy comprising the above-described Al and $Al_2O_3$ proportions, respectively. The individual bodies may have the features described above.

The same reference numerals in this description denote the same features. The individual features are to be considered combinable with each other unless technical reasons exclude their combination.

Figure 8:
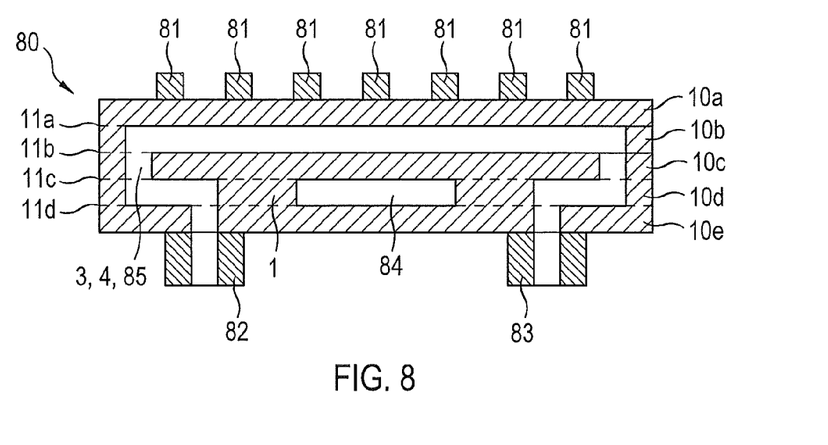
FIG. 8 shows the structure of a light emitting diode.

FIG. 8 shows a structure of a light emitting diode 80, which should not to be understood as up to scale. The reference numeral 1 denotes the object described above or produced as described above, that is, a cooling body consisting of several individual bodies 10a-e with transition portions 11a-d between them. Thereon, one or more light emitting diode chips 81 are attached, in case of several possibly with different spectral characteristic curves (colors). The chips may be soldered onto the cooling body 1. It may form an electric terminal of the light emitting diode. Further electric terminals, lines and components, not shown, may be provided. The cooling body is provided with supply and drain terminals 82, 83 for the fluid circulating in the object. 85 is a fluid channel formed by the cavities 3, 4 in the cooling body. Differently to what is shown, several terminals may be provided. One or more terminals may be attached laterally and/or on top. 84 denotes a cavity generated due to a compensation opening, which may be separated from the fluid channel or be in communication with it.

What is claimed is:

1. Method for bonding two partially form-fitting surfaces of two metal bodies which comprise the same metal, comprising the steps of:
   (a) generating a first layer on the partially form-fitting surface of a first one of the two bodies, the first layer comprising a mixture of the metal and the oxide of the metal;
   (b) generating a second layer on the first layer, the second layer comprising the metal but less oxide of the metal than does the first layer;
   (c) placing the partially form-fitting surfaces of the two metal bodies adjacent to each other;
   (d) heating the bodies placed adjacent to each other to a temperature which lies in a target range below the melting point of the metal and above a eutectic temperature of a eutectic of the metal and the metal oxide; and
   (e) holding the temperature within the target range over a predetermined or a controllable duration of time two bond the two partially form-fitting surfaces of the two metal bodies together.

2. The method according to claim 1, characterized in that (f) before step (c) a first layer is also generated on the second body.

3. Method according to claim 2, characterized in that (g) after step (f) and before step (c) a second layer is also generated on the first layer of the second body.

4. Method according to claim 1 characterized in that the first layer is generated by oxidizing the material of the metal body.

5. Method according to claim 1, characterized in that the first layer is generated by applying the metal of the metal body in the form of fine particles on the surface thereof in an oxygen-containing atmosphere.

6. Method according to claim 5, characterized in that the application of the metal is a vacuum deposition process or a sputtering process.

7. Method according to claim 5, characterized in that the application is performed at room temperature.

8. Method according to claim 1, characterized in that the first layer is generated in such a way that before step (d) it comprises a hypereutectic proportion of oxygen.

9. Method according to claim 1, characterized in that the metal comprises at least 90% by weight of copper.

10. Method according to claim 1, characterized in that the second layer is generated by applying the metal of the metal body in the form of fine particles on the surface thereof in an inert atmosphere.

11. Method according to claim 1, characterized in that in step (d) and/or in step (e) the bodies are pressed together at least temporarily.

12. Method according to claim 1, wherein in step (d) the heating is performed in accordance with a predetermined temperature variation over time.

13. Method according to claim 1, characterized in that plate-shaped or foil-shaped bodies are used which can have recesses.

14. Method according to claim 13, wherein the plates have a thickness of below 2 mm.

15. Method according to claim 1, wherein the second layer is generated in such a way that its proportion of oxide is less than 10% of that of the first layer.

16. Method according to claim 1, wherein at least one of the two metal bodies comprises a Cu—Al alloy wherein Al is provided in a proportion of more than 0.02% by weight or more than 0.1% by weight and/or less than 1% by weight or less than 0.2% by weight, the remainder being essentially copper.

17. Method according to claim 16, wherein the Al is dispersed in the Cu in the shape of aluminum oxide particles.

18. Method according to claim 16, wherein during steps (d) and/or (e) pressure is exerted at least temporarily on the bodies superimposed on each other.

19. Method according to claim 18, wherein the pressure is exerted for at least 2 or at least 5 minutes and/or for at most 50 minutes or at most 30 minutes.

20. Method according to claim 18, wherein the heating to a target temperature is performed wherein the target temperature is below a melting point of the eutectic of copper and copper oxide without pressure load.

21. Method for bonding partially form-fitting surfaces of a plurality of metal bodies which comprise the same metal, comprising the steps of:
   (a) generating a first layer on the partially form-fitting surface of a first metal body, the first layer comprising a mixture of the metal and the oxide of the metal;
   (b) generating a second layer on the first layer, the second layer comprising the metal but less oxide of the metal than does the first layer;

(c) placing the partially form-fitting surfaces of the first metal body and a second metal body adjacent to each other;
(d) heating the metal bodies placed adjacent to each other to a temperature which lies in a target range below the melting point of the metal and above a eutectic temperature of a eutectic of the metal and the metal oxide; and
(e) holding the temperature within the target range over a predetermined or a controllable duration of time to bond the plurality of partially form-fitting surfaces of the plurality of metal bodies together.

22. Method according to claim 21, characterized in that three or more bodies are bonded to each other at the same time by preparing for each interface at least one of the surfaces according to steps (a) and (b) and, subsequently, performing steps (c) to (e) for all bodies together.

23. Method for producing an object with cavities therein, wherein the object is produced by bonding plate-shaped bodies forming individual layers of the object and being designed according to the desired cavities, characterized in that at least two bodies are bonded to each other by a method according to claim 21.

24. Method according to claim 23, wherein three or more bodies are simultaneously pressurized as a stack during heating and one or more compensation openings are provided in one or more bodies.

* * * * *